United States Patent
Prins

(10) Patent No.: US 10,211,292 B2
(45) Date of Patent: Feb. 19, 2019

(54) ELECTRICAL CONDUCTOR

(75) Inventor: Johan Frans Prins, Johannesburg (ZA)

(73) Assignee: SAGE WISE 66 (PTY) LTD, Johannesburg (ZA)

( * ) Notice: Subject to any disclaimer, the term of this patent is extended or adjusted under 35 U.S.C. 154(b) by 0 days.

(21) Appl. No.: 14/110,787

(22) PCT Filed: Apr. 13, 2012

(86) PCT No.: PCT/IB2012/051830
§ 371 (c)(1),
(2), (4) Date: Oct. 9, 2013

(87) PCT Pub. No.: WO2012/140611
PCT Pub. Date: Oct. 18, 2012

(65) Prior Publication Data
US 2014/0027788 A1   Jan. 30, 2014

(30) Foreign Application Priority Data
Apr. 14, 2011 (ZA) .................. 2011/02820

(51) Int. Cl.
H01L 29/15 (2006.01)
H01L 29/16 (2006.01)
H01L 21/04 (2006.01)

(52) U.S. Cl.
CPC ...... H01L 29/1602 (2013.01); H01L 21/0405 (2013.01)

(58) Field of Classification Search
CPC ............. H01L 29/1602; H01L 29/872; H01L 29/6603; H01L 29/47; H01L 21/0405
USPC ............................. 257/77–80; 438/105, 584
See application file for complete search history.

(56) References Cited

U.S. PATENT DOCUMENTS

H1287 H * 2/1994 Zeisse et al. ................. 257/410
2010/0117098 A1 * 5/2010 Ikeda et al. .................... 257/77

FOREIGN PATENT DOCUMENTS

WO   03/019597 A1   3/2003

OTHER PUBLICATIONS

Examination Report in EP12723744.4 dated Apr. 7, 2015 (six pages).
S. Prawer, et al., "Can ntype Doping of Diamond be Achieved by Li or Na Ion Implantation?", AIP Applied Physics Letters, vol. 63, No. 18, Jan. 1, 1993, p. 2502 XP055150292, ISSN: 0003-6951; DOI: 10.1063/1.110462, 4 pages.
Johan F. Prins, "The Diamond-Vacuum Interface: II. Electron Extraction from n-type Diamond: Evidence for Superconduction at Room Temperature", Institute of Physics Publishing, Semicond. Sci. Technol. vol. 18, Feb. 7, 2003, pp. S131-S140, XP055032988, 10 pages.
Michael W. Geis, et al., "Theory and Experimental Results of a New Diamond Surface-Emission Cathode", The Lincoln Laboratory Journal, vol. 10, No. 1, Jan. 1, 1997, pp. 3-18, XP000749210, 16 pages.

* cited by examiner

*Primary Examiner* — Brook Kebede
(74) *Attorney, Agent, or Firm* — Banner & Witcoff, Ltd.

(57) ABSTRACT

The invention provides circuits and electronic devices which comprise an electrical flow path, at least part of which is formed by a body of a substrate material at least part of which is a doped part having a surface and implanted atoms at or below the surface, at least part of the surface defining a low resistance section of the electrical flow path.

22 Claims, 5 Drawing Sheets

ELECTRICAL CONDUCTOR

THIS INVENTION relates to an electrical flow path, a conductor, an electronic component and electronic devices.

The Applicant has shown that low-energy ion-implantation of diamond using an oxygen-plasma, can produce a high density of electron donor-sites very near to and below the surface of the diamond so that electrons can be extracted from such a diamond by an electric-field between the surface of the diamond and an anode (PCT/IB02/03482). The experimental arrangement is shown schematically in FIG. 1. The Applicant found that, above a critical voltage, a black rod, which connected the diamond-surface to the anode, formed and an equilibrium-current then flowed through the circuit. Without being bound by theory, the Applicant believes that, when electrons are extracted perpendicularly from the diamond surface, a dipole layer consisting of positive donor charges just below the surface and external electrons tightly bonded to the surface by these positive charges, forms across the surface. By applying a voltage by means of the anode, the dipole layer grows in width until the externally bonded electrons make contact with the anode. This frees the tightly bound external electrons forming the negative layer of the dipole: An electron-current can then flow perpendicularly to the diamond's surface from the diamond through the externally-bonded electrons into the anode.

Without being bound by theory, but based on the physics-models of solid state electronic interfaces, the Applicant believes that there is no electric-field present along the rod even though it transfers a current from the diamond to the anode. Since this is the defining behaviour that Kamerlingh-Onnes discovered for superconduction in 1911, it appeared that the rod is a superconducting phase.

The possible electronic applications of the phase that forms in this manner are at present limited. It would be preferable if lateral flow, low resistance regions could be produced on, for example, an electronic chip. It is thus an object of the invention to produce a low resistance electrical flow path in which external electrons can move freely along the surface of a substrate such as oxygen-doped diamond. Ideally such regions should be superconducting, but even if they only have a much lower resistance than the connecting materials used at present, their generation would have a substantial impact on the speed and size of electronic chips incorporating such a doped substrate.

It is well known in the scientific literature on diamond that low energy oxygen-ion treatment of a diamond substrate totally quenches all lateral conduction along the surface of such a diamond. Only when using hydrogen has lateral conduction been observed, but this occurs below the surface of the diamond. In fact, if such a hydrogen-treated diamond is subsequently subjected to oxygen-ion treatment, even this conduction is quenched and thus disappears: The surface then becomes insulating along the lateral direction.

The Applicant has now found that by increasing the density of implanted oxygen ions (below and near to the surface) to very high values while, during the latter treatment, annealing the diamond to prevent the diamond surface from becoming graphitic, then, in contradiction to what has been reported in the scientific literature, lateral conduction does eventually initiate. It thus appears that, at these ion densities, the oxygen-plasma treatment no longer quenches lateral conduction, but actually causes conduction to occur. Subsequent experiments have shown that this lateral conduction occurs on the surface of, and externally to the diamond. This implies that some of the electrons which are bonded to the surface (to in this manner form a dipole layer across the surface) become free to transport a current laterally on the surface, and externally to the diamond. This produces an extremely low-resistance and hence an extremely low resistivity, pure-electron, conducting-phase external to the surface. This phase can be employed in the design and manufacture of novel electronic devices. The resistivity of these phases is far lower than that of the known metals and materials normally used to make connections on electronic chips.

It was subsequently found that the same conduction can also be generated when using nitrogen ions; and even hydrogen ions, provided that in the latter case the subsurface of the diamond is first pre-treated by low-energy carbon-ion implantation to generate a high density of vacant lattice sites. Any other ion (and even electrons) can also be used for the latter purpose, provided that a layer with vacancies forms near and below the surface. After subsequent hydrogen-plasma treatment, the conduction obtained is then not subsurface anymore, but also in this case occurs by free electrons which can move laterally and externally to the diamond. It seems that the presence of subsurface vacancies might be crucial to the generation of external lateral conduction on the surface.

Thus according to a first aspect of the invention, there is provided an electrical flow path, at least part of which is formed by a body of a substrate material at least part of which is a doped part having a surface and implanted atoms at or below the surface, at least part of the surface defining a low resistance section of the electrical flow path.

According to another aspect of the invention, there is provided a lateral electrical flow path, consisting of electron charges that are external to a surface of an n-type substrate-material and which, in contrast to the usual external electron-orbitals on a surface, are free to move under the influence of an electric-field applied along the surface of the substrate material, the charges being generated by a high density of donor-flaws within the substrate, at and near to the surface of the substrate.

The electrical flow path may be part of a circuit which may include a voltage source. The body of substrate material may form part of an electronic component and the circuit and the electronic component may be part of an electronic device.

The electronic component may be connected to the flow path by connectors. The resistivity of the low resistance section of the electrical flow path may be less than about $2 \times 10^{-8}$ Ω-m and will probably be less than about $5 \times 10^{-13}$ Ω-m.

The substrate material may be selected from materials which have low electron-affinities, like for example: diamond, carbon-based materials like graphene or graphene-dominated materials, polymers, cubic boron nitride, aluminium-nitride, gallium-nitride, β-alumina and the like. Carbon-based materials are preferred because they have short bond-lengths which allow higher dopant- and vacancy-densities.

The implanted atoms may be selected from oxygen, hydrogen, lithium, nitrogen, fluorine, chlorine, sulphur, phosphorus, arsenic and the like.

The connectors may be gold connectors, but should preferably have even lower electronic work-functions.

At least some of the implanted atoms may be at depths of between about 0.1 Å and 5000 Å below the surface of the substrate. The density of the implanted atoms may be between about $10^{17}$ cm$^{-3}$ and $10^{23}$ cm$^{-3}$.

According to another aspect of the invention, there is provided a conductor which includes an elongate substrate having a longitudinal surface which defines a current flow path extending along the length thereof, wherein at least part of the surface is a doped part.

According to another aspect of the invention, there is provided a conductor which is circular around a hole which defines a current flow path around the hole.

The invention thus provides a conductor in which the substrate has a passage extending through the substrate and the electrical flow path extending around the passage. In this embodiment if a DC-current is sent through the electrical flow path a magnetic flux is generated through the passage or hole. When switching off the power supply which injected the current into the electrical flow path the magnetic-flux remained trapped through the passage or hole. This indicates that the charge-carriers moving along the flow path encounter negligible resistance.

When connecting the flow path by contacts with an external resistor and ammeter, it was found that the ring acted as a power supply until the stored magnetic field became zero and thus, once charged, acted as a small battery.

According to another aspect of the invention, there is provided an electronic device which includes an electrical flow path, at least part of which is formed by a body of a substrate material at least part of which is a doped part having a surface and implanted atoms at or below the surface, at least part of the surface defining a low resistance section of the electrical flow path.

In a series of experiments, two gold-plated metal contacts were brought into contact with the surface of a diamond substrate which had been plasma-doped with oxygen atoms. The resistance between the contacts along the surface of the diamond was measured. Since the diamond was subjected to consecutive plasma-treatments in order to measure the resistance as a function of the ion density, the resistance measurements required that the two contacts must be mechanically pressed onto the diamond surface. This introduced a measure of irreproducibility in the results. However, the latter process allowed the measurement of the resistance as a function of ion-dose. To minimise the irreproducibility, a measuring-apparatus was eventually constructed as shown schematically in FIG. 2. In this case the treated diamond surface was lowered onto two gold-plated glass slides by a spring-loaded micrometer. The distance L between the contacts could be changed so the resistance could also be measured as a function of L.

An example of the change in resistance with implanted oxygen-ion dose is shown in FIG. 3. These measurements were all made for the same distance L between the contacts. At first nothing could be measured, just as expected for the oxygen-ion plasma-treatments which have been reported in the literature. But after an incubation ion-dose, measurable conduction appeared. As the ion dose increased further, the resistance decreased and then saturated at an average value of about 200 k$\Omega$. This suggests that the density of donors nearest to the surface cannot increase indefinitely and reaches a saturated maximum value. This result was consistently produced in a number of diamonds and the scatter in the results could in all cases be solely ascribed to the irreproducibility in the contact resistances.

When the distance between the contacts was increased the resistance, within experimental error, did not change. This indicates that the measured resistance was dominated by the resistances of the contacts and that the diamond substrate had a near zero resistivity. FIG. 4 shows the current as a function of the distance L between the two contacts for the same voltage at six different distances L between the contacts. The data points fall well within the normal scatter obtained for all these experiments, indicating that the current is the same for any distance L.

Without being bound by theory, if the near-surface donors emit enough electrons for some of them to accumulate on the surface as free electrons which can then transport a current laterally with low resistivity, the contacts will encounter such electrons as soon as they are pressed against the surface. Therefore those electrons, which are present on and around the contact areas before pushing the contacts onto the surface, should under these conditions flow into the metal-contacts. This will in turn generate a dipole across the diamond-metal interface and each metal-contact will then become negatively-charged. Such a contact will then push surrounding free electrons (if they are present on the surface) away. This is schematically illustrated in FIG. 5 which shows high resistance gaps of lengths $\Delta L$ which form at the contacts. The circles represent the free electrons schematically.

In a number of experiments, using different diamonds, the same results were obtained within experimental error. When a longer type Ib diamond was used the voltage across two points between, and spaced far away from the two contacts, was measured but the voltage was so low that it was not possible to make a reliable measurement. This suggested that the resistivity between the contacts was far lower than the resistance of the contacts. Again without being bound by theory, these results suggested that the current is transported by free electrons on the surface but do not prove this conclusively since the current might be transferred below the surface.

However, the following analysis is completely commensurate with conduction on and external to the surface:

If it is assumed that, for a distance L, the material between the contacts has a resistance $R_P$ and each contact has a resistance $R_C$. The total resistance $R_\Omega$ is then given by:

$$R_\Omega = R_P + 2R_C \quad (1)$$

Assuming the diamond to have a width w, the apparent sheet resistivity can then be written as $R_{AS}$ where:

$$R_{AS} = \frac{wR_\Omega}{L} = \frac{wR_P}{L} + \frac{2wR_C}{L} \quad (2)$$

Assuming conduction on and external to the surface, the resistance caused by the gaps $\Delta L$ shown in FIG. 5 must be subtracted so that the actual sheet resistivity $R_S$ of the electron-phase in the gap L between the contacts will then be:

$$R_S = \frac{wR_P}{(L - 2\Delta L)} \quad (3)$$

Eq. 2 can thus be written as:

$$R_{AS} = R_S\left(\frac{L - 2\Delta L}{L}\right) + \frac{2wR_C}{L} \quad (4)$$

For L very large, one will have that $R_{AS} \rightarrow R_S$. However, if the external electron phase has zero-resistivity, then $R_S$ will be negligible for any value of $L \geq 2\Delta L$ right up to infinity. The second term will then completely determine the apparent sheet resistivity $R_{AS}$: When extrapolated to infinite values for L, $R_{AS}$ must then decay inversely with L towards zero. A plot of $R_{AS}$ as a function of inverse length 1/L must then give a linear relationship with a slope equal to $(2wR_C)$ which extrapolates to zero for $R_{AS}$ when 1/L goes to zero on the graph.

The apparent sheet resistivity $R_{AS}$ is plotted in FIG. 6 as a function of inverse L used in a single set of measurements on one of the diamonds. The data-point for very small L is shown in the bottom inset. A linear least squares fit was carried out using all the points. This resulted in the solid line and a value for $R_S=-28\Omega$ (see top inset in FIG. 6). Since the smallest distance could be affected by serrations at the edges of the glass slides, a least square fit was also carried out by neglecting this point. This resulted in the dashed line in FIG. 7 which gives an even lower sheet resistivity when $L^{-1}=0$. A sheet resistivity can never be negative so that these results are consistent with a very small resistivity, and strongly indicate zero resistivity. If a constant value for the contact resistances is not used but the assumption is made that they, in addition, decrease with increasing contact area, as they should when the conduction occurs below the surface, the sheet resistivity extrapolates to even larger negative values for "infinite" L. This is further evidence that the conduction is not occurring below the surface.

Subsequent measurements using more data points were all consistent with the conclusion that the sheet resistivity extrapolates to be near, if not exactly, zero when L becomes infinitely long.

The invention is now described, by way of example with reference to the following Examples and Figures, in which:

FIG. 1 is a schematic illustration of the experimental arrangement used in PCT/IB02/03482 to extract electrons from a highly-doped n-type diamond into the vacuum;

FIG. 2 schematically shows the experimental set-up used to lower an implanted diamond-surface onto two contacts that can be adjusted to have different distances L between them: The arm which lowered the diamond was spring loaded and had a micro-switch which opened as soon as the spring reached a certain compression;

Figure 5:
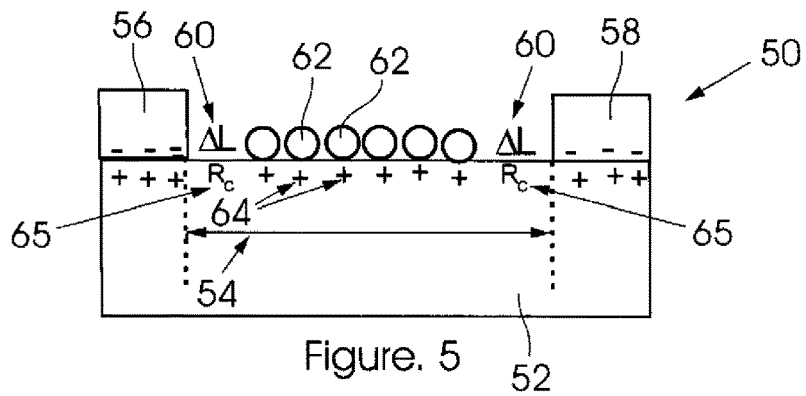
Figure 6:
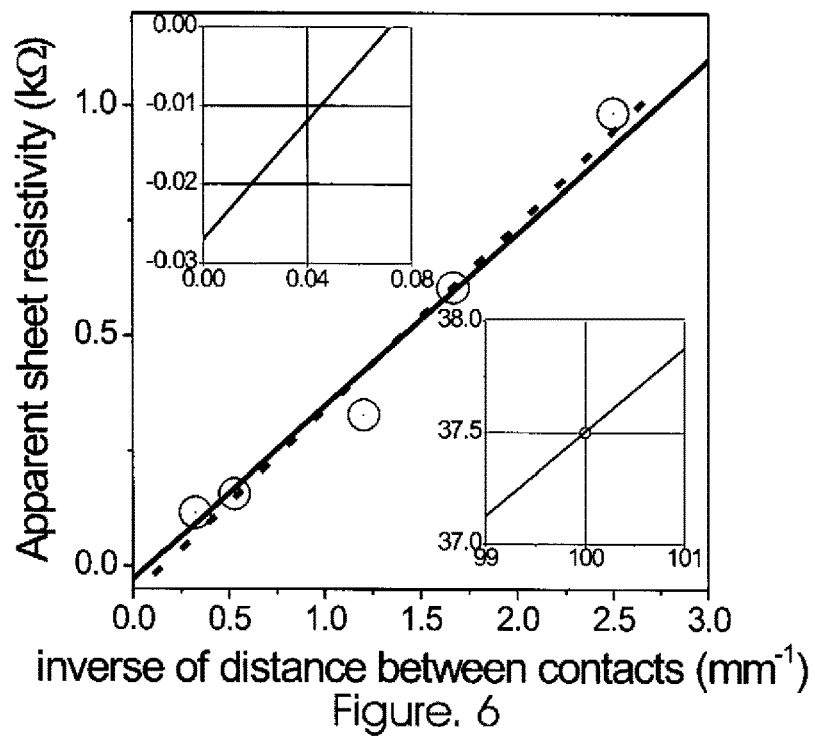
Figure 7:
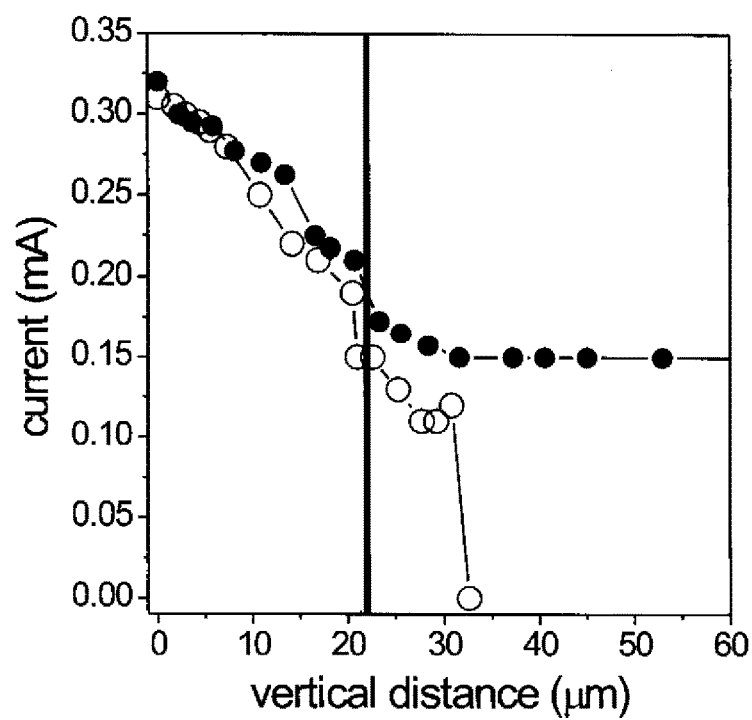

FIG. 5 schematically shows how gold-contacts become negatively charged and generate regions around them of length ΔL which have a high resistance, thus causing the contacts to dominate the resistance measurements when a current flows on, and external to the surface from one contact to the other;

FIG. 6 shows the apparent sheet resistivity as a function of the inverse of the distance L between the contacts; a least squares fit through the data points, extrapolates to a negative resistivity for $L^{-1}=0$ (i.e. for L equal to infinity);

FIG. 7 shows current measured through a doped type Ib diamond as a function of the vertical distance d of the contacts from the surface; data for the minimum and maximum distances between the contacts are shown.

Figure 8:
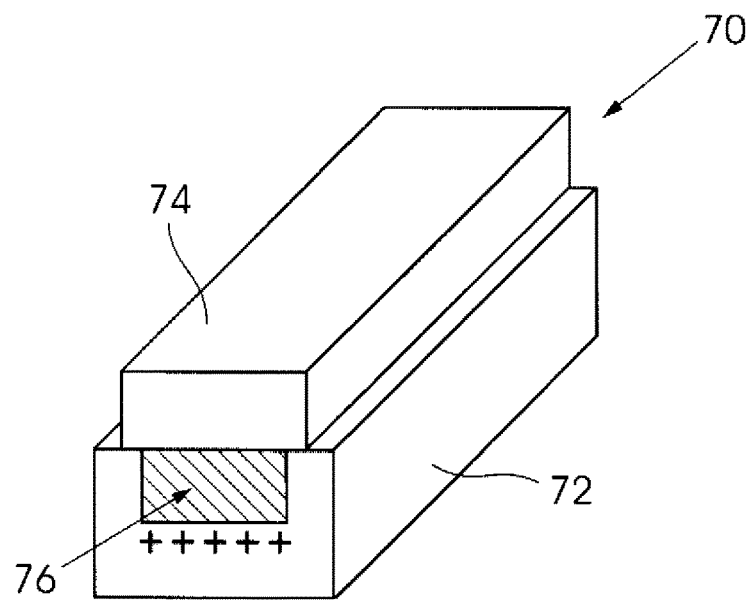

FIG. 8 is a schematic illustration of a conducting device having a pure-electron channel capped with a gold metal foil generated on a diamond substrate by means of oxygen-ion implantation; the resistivity was lower than for the metal layer without an electron-channel and was in fact too low to be measured.

Figure 9:
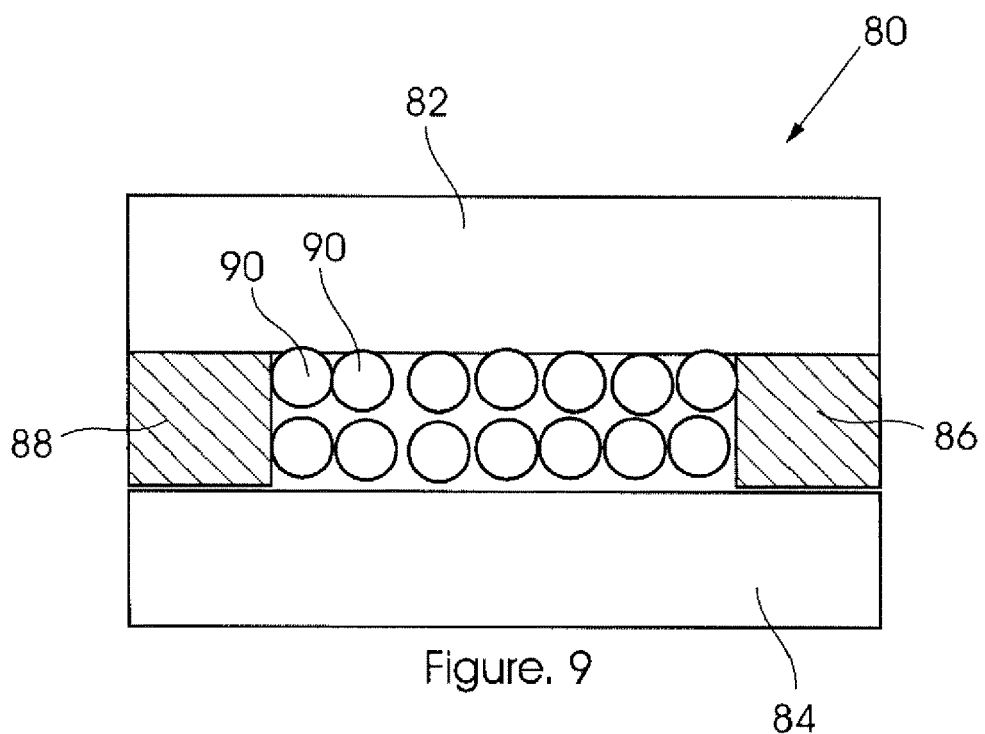

FIG. 9 is a schematic illustration of a conducting device where the charge-carriers are present between two diamond-layers each of which have electrons outside their surfaces after plasma treatment to, in this manner, contribute to the presence of electrons between the surfaces.

Figure 10:
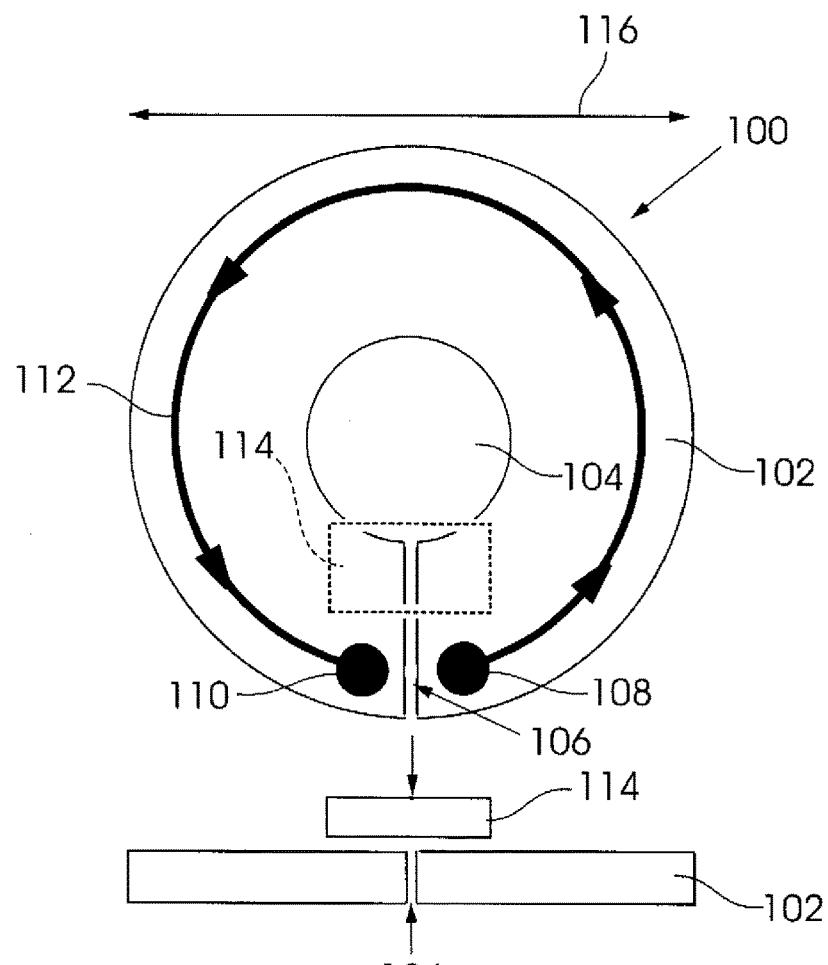

FIG. 10 shows a circular ring of diamond with slot cut into the ring from the hole to the outside of the ring. After treatment with an oxygen-ion plasma a current could be sent from one contact to another around the ring in order to generate a magnetic flux through the ring. After the current and magnetic-field have stabilised, another treated diamond was used as a bridge element to short circuit the ring across the slot.

Figure 11:
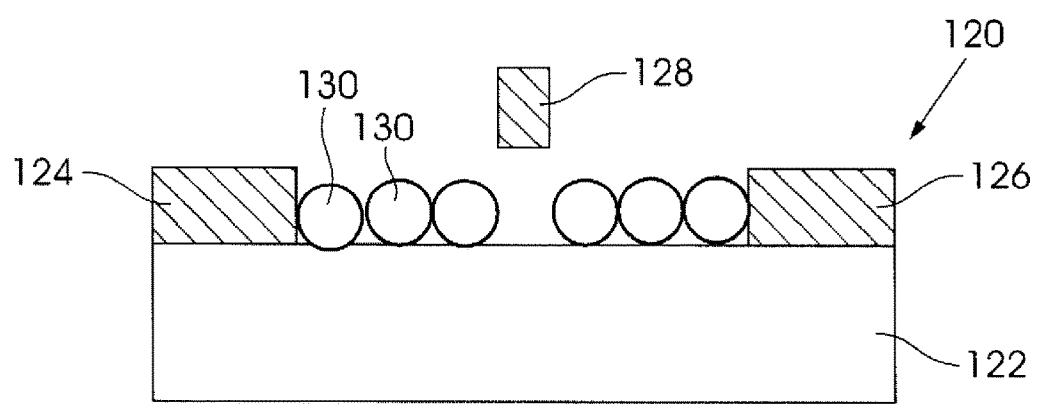

FIG. 11 is a transistor device which uses a metal gate to control and switch the current flowing through the device. In contrast to other transistors the gate resistance is negligible.

Figure 1:
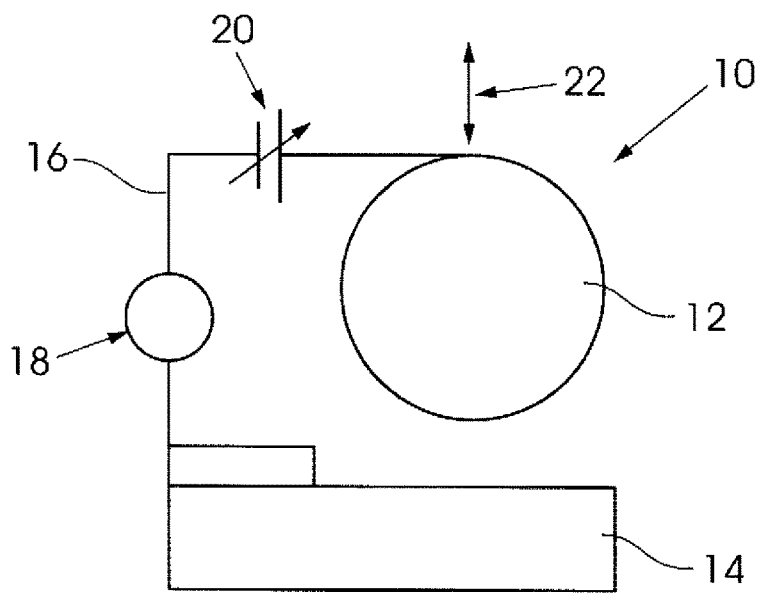

Referring to FIG. 1, reference numeral 10 is a schematic illustration of the prior art experimental arrangement of PCT/IB02/03482 to extract electrons from a highly-doped n-type diamond. The arrangement includes an anode 12, an n-type diamond 14, which are connected by a connector 16 containing an ammeter 18 and a voltmeter 20. The arrow 22 shows movement of the anode as measured by a micrometer (not shown).

Figure 2:
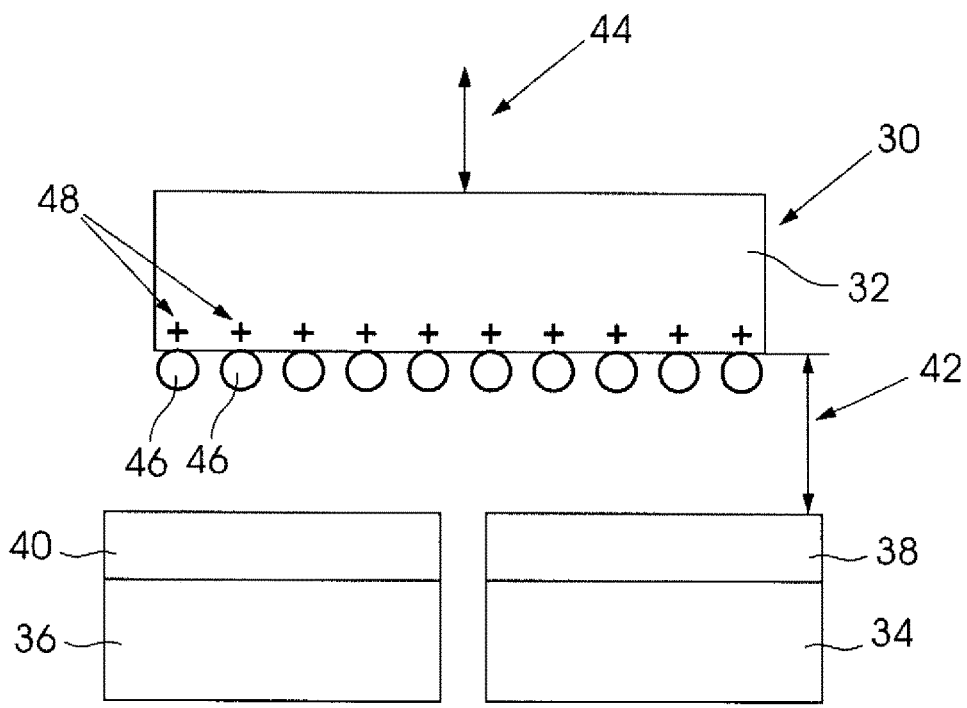

Referring to FIG. 2, reference numeral 30 shows an experimental set-up used to lower an implanted diamond-surface onto two contacts which can be adjusted to have different distances L between them. The experimental set-up includes a diamond substrate 32, glass slides 34, 36, a gold target contact 38 and a gold injection contact 40. The gap d(μm) is shown by the arrow 42. A micrometer adjusted gap is shown by the arrow 44.

Referring to FIG. 5, reference numeral 50 indicates an arrangement showing how gold-contacts become negatively charged and generate high resistance regions around them of length ΔL. In the diagram reference numeral 52 indicates a diamond substrate, the arrow 54 indicates the length L, 56 shows the injection contact and 58 shows the target contact. Reference numeral 60 shows ΔL and reference numeral 65 schematically shows contact resistance Rc. Reference numerals 62 schematically indicates the external orbitals and 64 the implanted ions.

Referring to FIG. 8, reference numeral 70 shows a conducting device having a pure-electron channel capped with a gold metal foil generated on a diamond substrate by means of oxygen-ion implantation. The device includes a diamond substrate 72, a metal layer 74 and a superconducting channel 76.

Referring to FIG. 9, reference numeral 80 shows a conducting device where the charge carriers are present between two diamond layers each of which has electrons outside their surfaces after plasma treatment. The device 80 includes diamond substrates 82 and 84 and contacts 86 and 88. The charge carriers are shown schematically by the circles 90.

Referring to FIG. 10, reference numeral 100 shows a top view of a circular ring-shaped diamond 102. The diamond 102 has a 4 mm hole 104 through it and a slot 106 extending from the hole 104 to the outside of the ring-shaped diamond 102. In and out contacts 108 and 110 are located adjacent the slot 106 and a circular current flow path 112, resulting from oxygen ion plasma treatment, extends from the contact 108 to the contact 110. After sending a current through the flow path 112 another treated diamond (114 shown in side view at the bottom of the drawing) is used as a bridge element to short circuit the ring across the slot 106. The diameter of the diamond is 11 mm as shown by the arrow 116.

Referring to FIG. 11, a transistor device 120 includes a diamond substrate 122, contacts 124 and 126 and a metal gate electrode 128 to switch the current flowing through the device. The charge carriers are again shown schematically by the circles 130.

EXAMPLE 1

Figure 3:
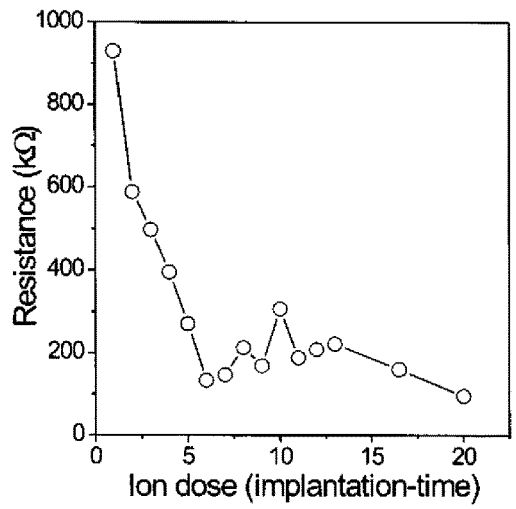
FIG. 3 is a typical plot (not the best one) showing the change in resistance as a function of implanted oxygen-ion dose.

To generate free electrons externally to the surface of a diamond, so that lateral charge transfer could take place along the surface, the surface of a natural type IIa (high purity) diamond with a surface area of 3.6×3.6 mm² was cleaned by boiling in a solution of hydrochloric, perchloric and sulphuric acids and then rinsed in distilled water. The cleaned diamond was heated and doped with oxygen by ion implantation with oxygen ions using a plasma implantation-apparatus. The diamond was biased at 150 volt in order to generate implanted atoms near to the surface and a number of implantations were carried out. Each implantation was conducted for a short period of about 60 seconds. Each implantation was carried out after the table on which the diamond was mounted had been heated to a temperature of 400° C. After each implantation step, the diamond was cooled to room temperature and removed from the vacuum system. The electrical resistance between two gold-plated metal contacts, spaced a distance L apart, was then measured by pushing the contacts onto the doped diamond-surface and recording the current as a function of the applied voltage. The results are shown in FIG. 3.

As the ion dosage increased (shown as implantation time on the x-axis in FIG. 3), an incubation ion-dose was reached beyond which conduction could be measured. With increasing ion-dose, the resistance dropped and, at higher doses saturated to the same value, within experimental error.

This process was repeated using different diamonds. Although there was a degree of scattering in the values of the measured resistance, the resistance in each case settled within experimental error at the same value when the same ion-energy was used.

EXAMPLE 2

The process of Example 1 was repeated but the distance L between the contacts was changed. Again, the resistance in each case settled within experimental error at the same value as that obtained in Example 1 when the same ion-energy was used.

EXAMPLE 3

Figure 4:
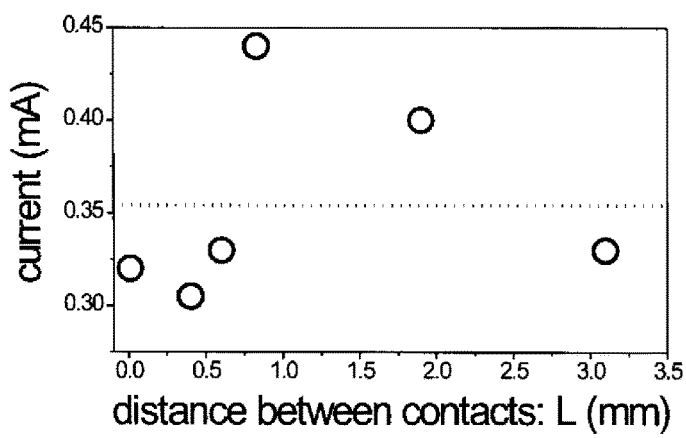
FIG. 4 is a magnified plot showing current as a function of the distance L between two contacts for the same voltage at six different distances L between the contacts on the surface of an oxygen-doped diamond.

In a variation of the process of Example 1, a relatively long diamond was used. The two contacts were displaced to be at various distances L of between 0.01 mm and 3.1 mm. The experimental set-up is schematically illustrated in FIG. 2. The resistances for different distances L between the contacts were measured and the results are shown in FIG. 4. From the figure it can be seen that, for distances L from 0.01 mm to 3.1 mm, the average value of the current was slightly above 0.35 mA. The current for L=0.01 mm was lower than that for L=3.1 mm even though the latter distance is 310 times longer. This suggests that, within experimental error, the current is the same for all values of L.

EXAMPLE 4

The process of Example 3 was repeated using a relatively long synthetic type Ib diamond. When moving the diamond vertically relative to the contacts, the total resistance was measured as a function of the micrometer-movement. The accuracy was ±0.2 µm. Special care was taken to ensure that the diamond's surface was parallel to the surfaces of the contacts. The currents measured between the contacts for smallest and largest distances between the contacts given by L=0.01 mm and L=3.1 mm, as a function of vertical micrometer movement, are shown in FIG. 7.

From the position at which the micro-switch acts, up to a micrometer-movement of 22.5 µm, the diamond was still touching the contacts although with decreasing pressure. The vertical bar in FIG. 7 shows the distance at which the diamond clears the contacts. At that point the vertical distance d between the surface of the diamond and the contact-surfaces is zero. In both cases a current flows when the gap distance d is larger than zero. This shows that an external electron-phase is present between the diamond-surface and the contacts.

For the distance L=0.1 mm between the contacts, the current stabilised at about 0.15 mA. Current-flow at this value could be measured up to a value of d≅82.5 µm. For the large gap between the contacts L=3.1 mm, the current started to stabilise but collapsed to zero at a distance d≅10 µm. In the latter case the contacts covered a far smaller surface area of the diamond than in the case where L is very small.

EXAMPLE 5

In order to produce a device for which there is no gap L, i.e. to generate a phase between the diamond and a single metal contact-layer on top of the external electron-layer a channel was generated within a diamond by a series of high-energy carbon-ion implantations to a very high dose, followed by annealing and etching away the graphitised material in a boiling solution of hydrochloric, sulphuric and perchloric acids. The channel depth was estimated to be d≈1 µm or more. The bottom of the channel was then rendered n-type conducting by implanting suitable shallow oxygen-donors within the channel to a very high dose. A gold foil was placed on top of the channel and secured in place with an adhesive along its edges. The device is schematically illustrated in FIG. 8. The distance between the base of the channel and the surface of the metal was, in different embodiments, between about 3-5 Å and 100 µm. The resistance inside the channel was measured and compared to the resistance inside the channel of a similar device in which the ion implantation step had been omitted. The resistance was found to be far lower for the device that had been implanted and was, within the accuracy of the measuring equipment, essentially zero.

EXAMPLE 6

Two diamond substrates with the same surface areas were treated and used to form a sandwich by spacing their conducting surfaces apart with metal contacts, as shown in FIG. 9. In this way an internal low resistance channel could be formed between the diamond surfaces. By using such diamond layers, treating both sides of each layer, and stacking them, one can generate a low resistivity element with a large cross-sectional area.

EXAMPLE 7

In this example a diamond substrate was machined to form a ring with a slot cut from the hole in the ring to the outside as shown in FIG. 10: The ring was then treated to become conducting so that a current could be send around the hole between two contacts on opposite sides of the slot.

The dashed square shown in the top view is a separate diamond block which has also been made conducting. It can thus be used to bridge the slot between the two contacts when lowered onto the diamond ring so that the electrons on the bottom of the diamond block make contact with the electrons on the surface of the ring.

At first the bridge was kept above the ring (see side view) so that it did not make contact. A DC-current was then sent around the ring from one contact to the other in order to generate a magnetic flux through the hole surrounded by the ring. The bridge was then established by lowering the diamond block. When switching off the power supply, which injected a current around the ring, it was found that magnetic-flux stayed trapped through the hole of the ring. This proves that the charge-carriers moving around the ring encounters negligible resistance.

When connecting the contacts with an external resistor and ammeter, it was found that the ring now acts as a power supply until the stored magnetic field became zero. Thus, once charged, the ring acts as a small battery.

EXAMPLE 8

In this example a long diamond substrate with a rectangular surface was used. After being treated to become conducting owing to the presence of electrons on the surface, a small gate metal electrode was held above the surface of the conducting diamond as shown in FIG. 11.

By applying a negative charge to this gate-electrode, the electrons below it could be pushed back into the surface of the diamond so that current flow stops. The device thus acted as a transistor-switch. It was also found that one could modulate a DC-current by changing the applied voltage to the gate electrode, so that the device also operated as an analog-transistor. This transistor has near zero, if not actually zero resistivity under the gate electrode. Since it is this resistivity which is limiting the speeds which can be obtained within processor chips, such a miniaturised external-electron transistor should enable the manufacturing of faster processor chips than those available at present.

All the measured results show that conduction occurs by means of free charge-carriers outside the diamond surface and that therefore the electrical resistance is negligible.

The invention claimed is:

1. A substrate material having a body comprising a substrate surface, at least a part of the body of the substrate material defining an electrical flow path, the flow path being obtained by generating a high density of shallow donors below the substrate surface, which operatively releases electrons that accumulate outside and above the surface where the electrons constitute the electrical flow path at least part of which extends along at least part of the surface, such that lateral conduction occurs externally to, and at a distance from the surface of, the substrate material.

2. The substrate material as claimed in claim 1, wherein the electrical flow path is part of a circuit.

3. The substrate material as claimed in claim 2, in which the body of the substrate material is part of an electronic component and the circuit and the electronic component are parts of an electronic device.

4. The substrate material as claimed in claim 3, in which a remainder of the electronic component is connected to the electrical flow path by connectors.

5. The substrate material as claimed in claim 4, in which a resistivity of the low resistance section of the electrical flow path is less than about $2 \times 10^{-8}$ Ω-m.

6. The substrate material as claimed in claim 1, in which a resistivity of the low resistance section of the electrical flow path is less than about $2 \times 10^{-8}$ Ω-m.

7. The substrate material as claimed in claim 6, in which the resistivity of the low resistance section of the electrical flow path is less than about $5 \times 10^{-13}$ Ω-m.

8. The substrate material as claimed in claim 1, in which the implanted atoms are selected from at least one of the following: oxygen, hydrogen, lithium, nitrogen, fluorine, chlorine, sulphur, phosphorus, arsenic and combinations thereof.

9. The substrate material as claimed in claim 1, in which at least some of the implanted atoms are at depths of between about 0.1 Å and 5000 Å below the surface of the substrate material.

10. The substrate material as claimed in claim 1, in which a density of the implanted atoms is between about $10^{17}$ cm$^{-3}$ and $10^{23}$ cm$^{-3}$.

11. The substrate material as claimed in claim 1, wherein the electrical flow path comprises a conductor.

12. The substrate material as claimed in claim 11, in which the substrate material comprises a passage extending through the substrate material and the electrical flow path extends around the passage.

13. The substrate material of claim 12, wherein the passage comprises an electrically conductive contact coupled to the substrate material.

14. The substrate material as claimed in claim 2, in which the body of the substrate material is part of an electronic component and the circuit and the electronic component are parts of an electronic device.

15. The substrate material as claimed in claim 2, in which a resistivity of the low resistance section of the electrical flow path is less than about $2 \times 10^{-8}$ Ω-m.

16. The substrate material as claimed in claim 3, in which a resistivity of the low resistance section of the electrical flow path is less than about $2 \times 10^{-8}$ Ω-m.

17. The substrate material as claimed in claim 14, in which a resistivity of the low resistance section of the electrical flow path is less than about $2 \times 10^{-8}$ Ω-m.

18. The substrate material of claim 1, wherein the substrate material comprises diamond.

19. The substrate material of claim 1, wherein the substrate material has a low electron affinity.

20. A circuit that comprises substrate material as claimed in claim 1.

21. A substrate material comprising:
a body having an exposed substrate surface, the exposed substrate surface having a high density of shallow donors below the exposed substrate surface, the exposed substrate surface configured to receive but not contact electrical conductors,
wherein the exposed substrate surface defines an electrical flow path, the flow path resulting from electrons that accumulate outside and above the exposed surface from the high density of shallow donors below the exposed substrate surface, and
wherein lateral conduction occurs between the electrical conductors above the exposed substrate of, and at a distance from the surface of, the substrate material.

22. A circuit comprising:
a substrate having an exposed substrate surface, the exposed substrate surface having a high density of shallow donors below the exposed substrate surface, the exposed substrate surface configured to receive but not contact electrical conductors of different voltage potentials, the exposed surface separated by a non-zero distance from the electrical conductors,
wherein the exposed substrate surface defines an electrical flow path, the flow path resulting from electrons that accumulate outside and above the exposed surface from the high density of shallow donors below the exposed substrate surface, and
wherein lateral conduction occurs between the electrical conductors of different voltage potentials above the exposed substrate.

* * * * *